United States Patent [19]

Rinaldi

[11] Patent Number: 5,027,072
[45] Date of Patent: Jun. 25, 1991

[54] ALTERNATE METHOD OF FOURIER TRANSFORM NMR DATA ACQUISITION

[75] Inventor: Peter L. Rinaldi, Lodi, Ohio

[73] Assignee: The University of Akron, Akron, Ohio

[21] Appl. No.: 447,371

[22] Filed: Dec. 7, 1989

[51] Int. Cl.⁵ .......................................... G01R 33/20
[52] U.S. Cl. .................................. 324/312; 324/307
[58] Field of Search ............... 364/485; 324/300, 307, 324/309, 312, 310, 314, 311; 128/653 A

[56] References Cited

U.S. PATENT DOCUMENTS 4,034,191 7/1977 Tomlinson et al. ............... 364/485
4,703,270 10/1987 Hall et al. ........................... 324/310

Primary Examiner—Michael J. Tokar
Attorney, Agent, or Firm—Oldham & Oldham Co.

[57] ABSTRACT

An acquisition method for multi-dimensional Fourier transform NMR data allows efficient accumulation of the data and provides artifact suppression in the acquired data under many circumstances. The method comprises performing an excitation pulse sequence having at least one evolution period wherein excited nuclei will at least partially relax. A transient generated from the pulse sequence is collected and stored, and the sequence is repeated with the evolution period varied in a predetermined manner. Transient information is collected for all values of the evolution period, and then the phase of at least on RF pulse may be varied and the procedure repeated. Subsequently transient information having common evolution periods may be signal averaged to obtain the NMR data. The method avoids residual magnetization effects under many circumstances, and significantly reduces acquisition time for data collection in spectroscopy or imaging environments.

18 Claims, 4 Drawing Sheets

PRIOR ART
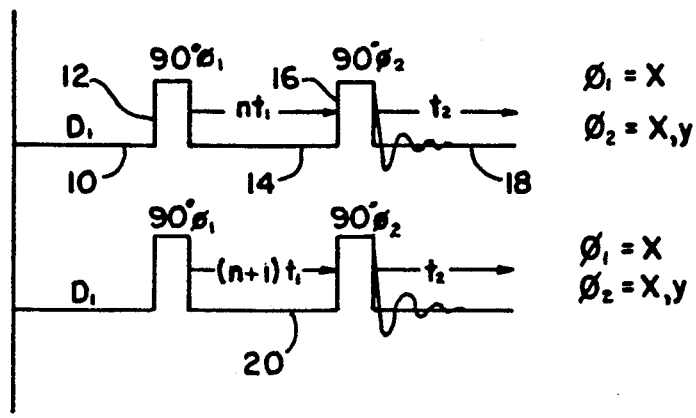
FIG.1A
FIG.1B
$\phi_1 = X$
$\phi_2 = X, y$
$\phi_1 = X$
$\phi_2 = X, y$
FIG.2A  FIG.2B  FIG.3A  FIG.3B
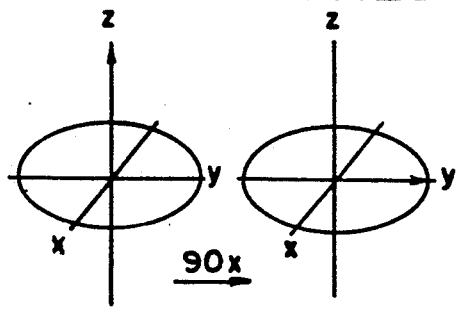 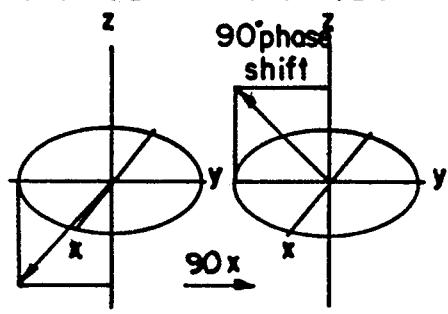
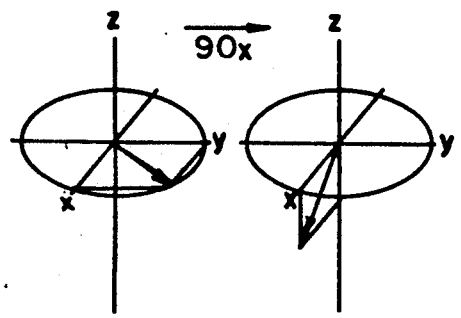 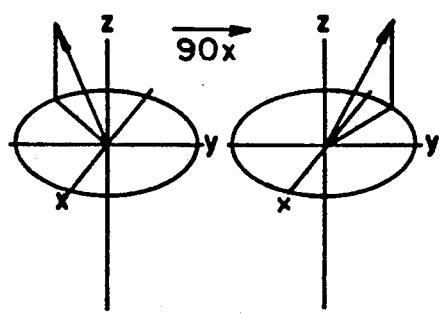
FIG.2C  FIG.2D  FIG.3C  FIG.3D FIG.4
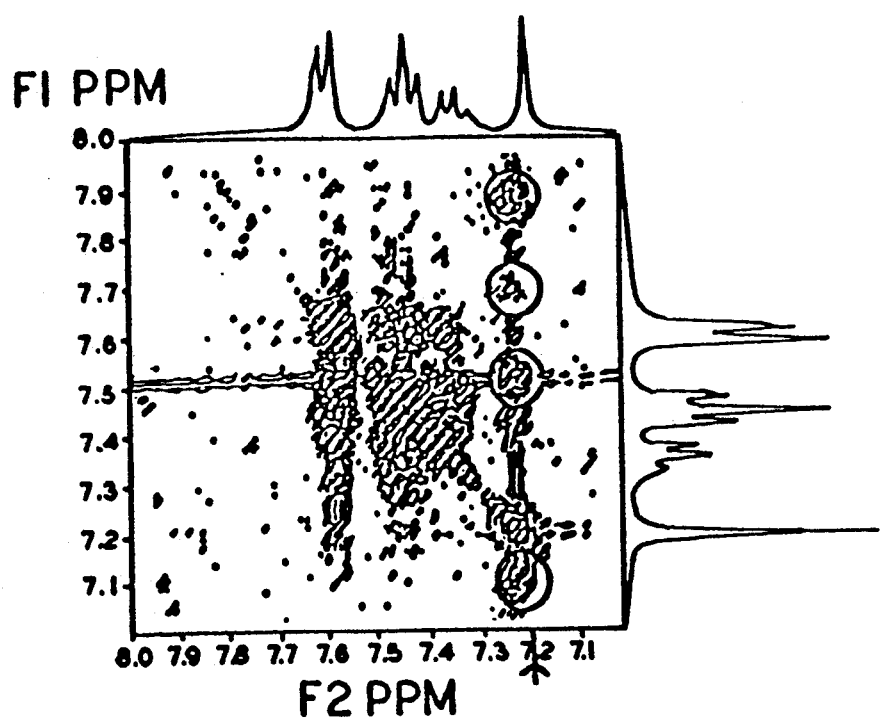
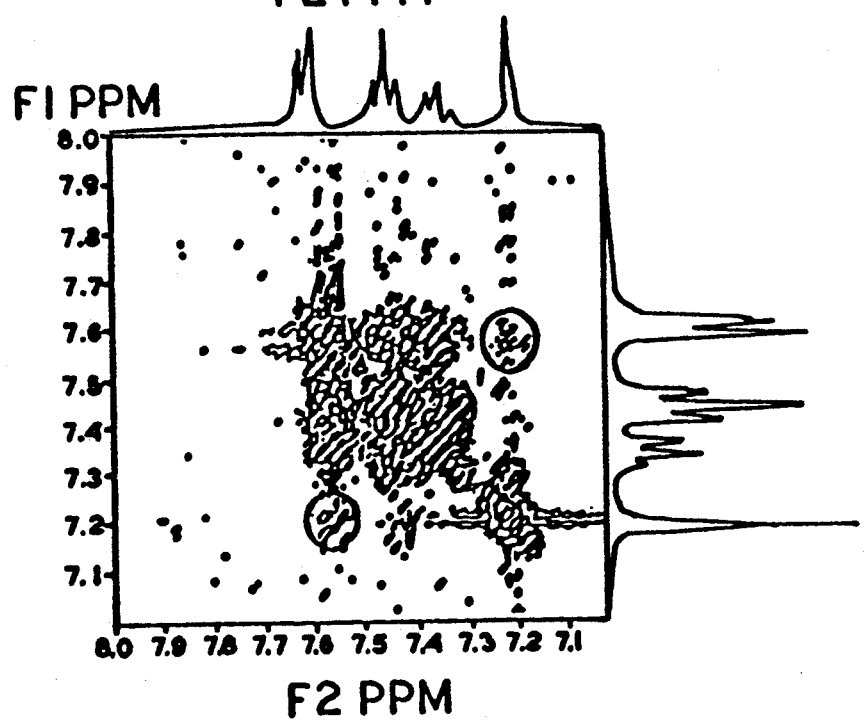
FIG.8

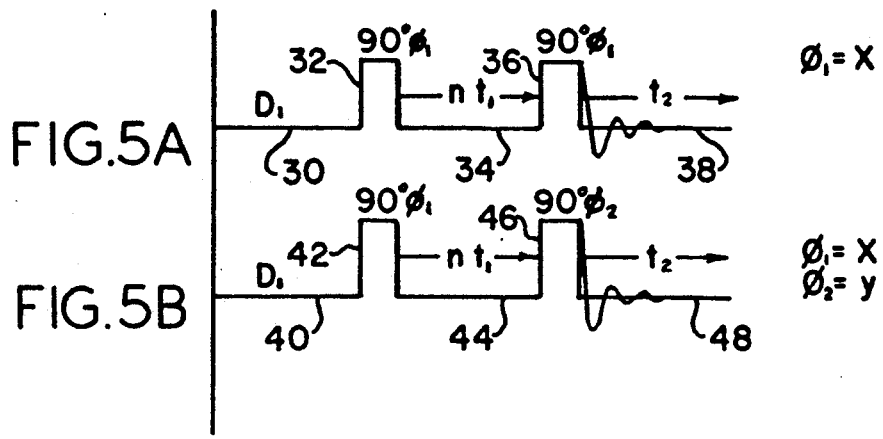
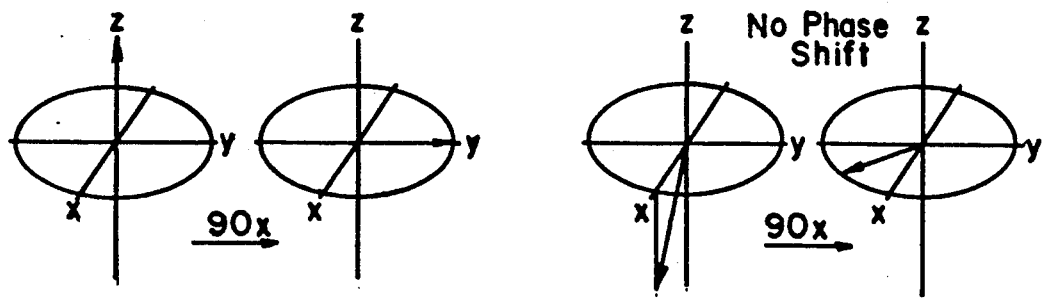
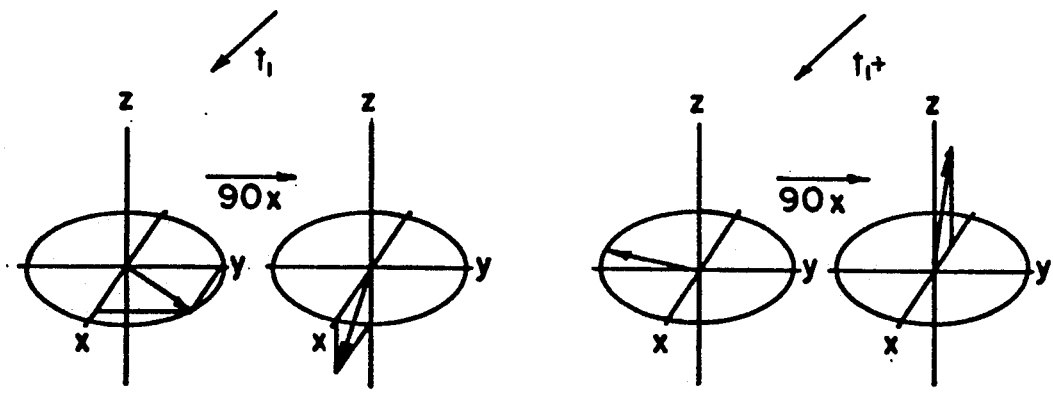

FIG. 9A
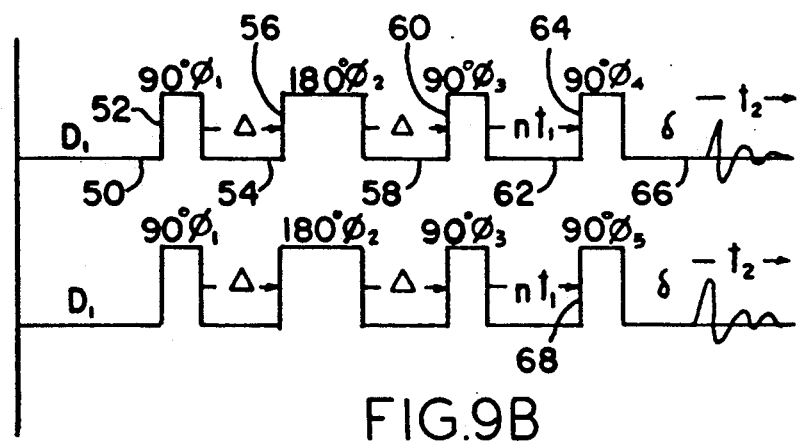
FIG. 9B
FIG. 10A
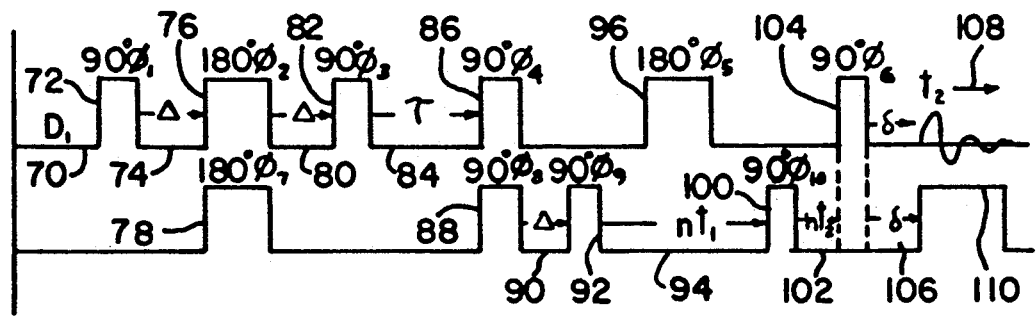
FIG. 10B

ALTERNATE METHOD OF FOURIER TRANSFORM NMR DATA ACQUISITION

TECHNICAL FIELD

This invention is directed to a new method for collection of NMR data. More particularly, the method of the invention enables collection of NMR data with suppression of artifacts remaining after instrument hardware errors have been resolved while simultaneously greatly reducing the total experimental time for collection of the data.

BACKGROUND OF THE INVENTION

Multi-dimensional Fourier transform NMR spectroscopy, and imaging techniques, sometimes referred to as FT-NMR, is an important tool for characterizing the structure of complex molecules and is routinely used to provide information about chemical and biological systems and is becoming progressively important as a diagnostic imaging tool. Artifacts can complicate or lead to false interpretation of the data as well as obscure important spectral or image information. If artifacts result in misinterpretation of the spectral or image data, it should be evident that the resulting confusion will inhibit effective research and progress in our understanding of these systems. For example, the standard spectroscopic method for collection of COSY spectra, will generally produce artifacts at the frequencies of strong narrow resonances which can be confused with peaks that indicate J-coupling.

Methods of eliminating artifacts in 2D-NMR spectra and other NMR data have been previously proposed and include reduction of artifacts arising from such sources as instrument hardware including instabilities in RF phase and flip angle, variations in sampling intervals, lock and magnetic field instability, modulation of NMR signals by sample spinning, instabilities in receiver gain, in RF phase shifting, limited computer word length and others. (See, for example Mehlkcopf, et al. *J. Magn. Resonance*, 58, 315 (1984), Wider et al. *J. Magn. Resonance*, 56, 207 (1984) and Nagayama et al. *J. Magn. Resonance*, 31, 133 (1978)).

Careful instrument design and proper instrument maintenance have been used to remove most of the above stated problems. However, other sources of artifacts have also been identified. These problems include artifacts arising from post data acquisition processing including inaccuracies in Fourier transforms, improper weighing functions, and round-off errors in the Fourier transform.

Techniques have been described to resolve a number of these deficiencies in FT-NMR and other NMR experiments. Specifically, there have been techniques used to remove artifacts which arise from intense narrow resonances. Kramer et al. has disclosed (in U.S. Pat. No. 4,616,182) that certain resonant signal artifacts can be removed by applying a specific type of two-pulse sequence in an imaging system which results in phase variance of artifact signals. This two-pulse sequence causes the artifact signals to be reduced in amplitude or translated from the center of the NMR image acquired.

Glover et al. (in U.S. Pat. No. 4,616,183) has disclosed a method for reducing baseline error components in NMR studies by deriving a baseline error signal and thereafter using this signal to compensate for the error in the acquired NMR data. This invention also discloses certain types of pulse sequences and collection methods for refining signals. In spectroscopy experiments, baseline error corrections have been used to remove $t_1$ ridges or other artifacts, but require longer acquisition times and do not address discrete artifacts but only baseline offset errors.

Although numerous techniques have been employed to attempt to remove or eliminate artifacts, artifacts in highly symmetrical strong resonances still remain and still plague NMR spectral interpretation or imaging, especially by people that are not extremely well trained in these areas. Artifacts which result from the inherent response of the nuclear spins to the pulse sequences used in the experiments have not been accounted for. The duration of the pulses used in standard types of spectral data collection techniques such as COSY, NOESY or ROSEY arise from the fact that the sample is not allowed to relax completely after the pulse sequence. Therefore, parts of the spectrum that were not allowed to relax will continue throughout the remainder of the sequence, and appear as additional artifacts.

For example, the standard method for collection of COSY 2D-FT-NMR data involves collection of all transients in a single evolution time before incrementing $t_1$. Appropriate phase cycling to systematically eliminate some artifacts, and cancellation of DC offsets which might arise from imbalanced receiver channels facilitates the method. A pulse sequence conventionally used in this method is shown below:

$$(90_x\text{-}0\text{-}90_x\text{-}AT)_{ss}, (90_x\text{-}0\text{-}90_x\text{-}AT)_{NT}, (90_x\text{-}0\text{-}90_y\text{-}AT)_{ss}, \quad (1)$$

$$(90_x\text{-}0\text{-}90_y\text{-}AT)_{NT}, (90_x\text{-}0\text{-}90_x\text{-}AT)_{ss}, (90_x\text{-}T\text{-}90_x\text{-}AT)_{NT},$$

$$(90_x\text{-}0\text{-}90_y\text{-}AT)_{ss}, (90_x\text{-}T\text{-}90_y\text{-}AT)_{NT}, (90_x\text{-}0\text{-}90_x\text{-}AT)_{ss},$$

$$(90_x\text{-}2T\text{-}90_x\text{-}AT)_{NT}, (90_x\text{-}0\text{-}90_y\text{-}AT)_{ss}, (90_x\text{-}2T\text{-}90_y\text{-}AT)_{NT} \ldots$$

$$(90_x\text{-}nT\text{-}90_x\text{-}AT)_{NT}, (90_x\text{-}nT\text{-}90_y\text{-}AT)_{NT}$$

where x is 0°, 90°, 180° or 270°, y is x+90°, ss is the number of dummy steady state pulse cycles which are discarded before transient acquisition, NT is the number of transients averaged, n is the number of $t_1$ increments, and AT is the acquisition time. The dummy scans are used to establish what in principle should be a steady state, and are not stored or used to obtain NMR data. Ideally, the repetition time for each cycle should be 5-10 times the $T_1$ value of the proton in the molecule. Using a pulse sequence having a long relaxation delay to compensate for slower relaxing molecules is practically impossible since this would require 12-24 hours to collect a single spectrum. Therefore, zero to one second relaxation delays are normally used to permit reasonably short experiment times (1-2 hours).

When magnetization is not permitted to fully decay (as is typically the case) this method produces systematic $t_1$ artifacts such as the characteristic "false" COSY cross-peaks that appear at the frequencies of strong narrow resonances.

With short repetition times, longitudinal and transverse magnetization which survives a first 90-$t_1$-90 cycle gets carried through additional cycles and contributes to the observed signal in subsequent transients. For example, magnetization from methyl or isolated aromatic protons, which have long relaxation times and produce intense sharp signals, are especially prone to produce artifacts. In fact, these and other protons can produce magnetization components which are carried through many cycles and can contribute to numerous COSY artifacts.

In typical 2D-FT-NMR acquisition methods, phase cycling methods are commonly used which prevent a true steady state magnetization from being established. Calculations of the observed COSY signal after one or more cycles show that residual magnetizations do indeed survive and carry a history of their behavior through successive evolution periods. These residual magnetizations that survive for n cycles will produce artifacts at n times the precession frequencies of the contributing signals.

For example, it can be shown that when using phase cycling techniques, the observable COSY signal at $t_2=0$ from an AB system after the first transient ($x=0°$) is described by:

$$\sigma^{obs} = I_{Ax} \sin(\Omega_A t_1) \cos(\pi J t_1) + \quad (2)$$

$$I_{Bx} \sin(\Omega_B t_1) \cos(\pi J t_1) - 2I_{Az}I_{By} \sin(\Omega_A t_1) \sin(\pi J t_1) -$$

$$2I_{Ay}I_{Bz} \sin(\Omega_B t_1) \sin(\pi J t_1)$$

where $\Omega_{A,B}$ are the precession frequencies of A and B respectively.

It has been found that after a 90° phase shift ($x=90°$), the observable COSY signal becomes as follows:

$$\sigma^{obs} = I_{Ax} \sin(\Omega_A t_1) \cos(\pi J t_1) + \quad (3)$$

$$I_{Bx} \sin(\Omega_B t_1) \cos(\pi J t_1) - 2I_{Az}I_{By} \sin(\Omega_A t_1) \sin(\pi J t_1) -$$

$$2I_{Ay}I_{Bz} \sin(\Omega_B t_1) \sin(\pi J t_1) - \tfrac{1}{4} * 2I_{Az}I_{By} \sin(2\Omega_A t_1) \sin(2\pi J t_1) +$$

$$A_y \sin(\Omega_A t_1) \cos(\pi J t_1) - \tfrac{1}{4} * 2I_{Az}I_{By} \sin(2\Omega_A t_1) \sin(2\pi J t_1) +$$

$$I_{By} \sin(\Omega_B t_1) \cos(\pi J t_1) - \tfrac{1}{4} *$$

$$2I_{Az}I_{By} \sin(2\Omega_B t_1) \sin(2\pi J t_1) - \tfrac{1}{4} * 2I_{Az}I_{By} \sin(\Omega_B t_1) \sin(2\pi J t_1)$$

The first four terms of this expression represent the normal COSY diagonal and cross peaks while the last terms show residual magnetization components. These residual magnetization components which survive through a second cycle will carry a history of their behavior through two $t_1$ evolution periods and show additional cross peaks at $2\Omega$ in the $f_1$ dimension. The residual magnetization components in the observable COSY signal could be destroyed by the application of a "homospoil" pulse sequence or a 90° RF pulse sandwiched by two gradient pulses. Unfortunately, application of a "homospoil" pulse would disrupt a stable lock condition in the system and produce a different set of artifacts.

It has thus been found that phase cycling techniques may be used to eliminate undesirable magnetization effects which are not accounted for in standard acquisition techniques but other discrete artifacts are produced. The elimination of the discrete artifacts due to residual magnetization would require the elimination of phase cycling techniques in standard acquisition methods, which are used in the elimination of other artifacts. These contrary requirements have led to a choice being made between which artifact producing components will be accounted for in the acquisition method.

Another problematic aspect of presently known acquisition methods lies in the inability to conduct the NMR experiments in an efficient manner. A typical 2D-FT-NMR spectroscopy experiment will include signal averaging techniques as well as the use of dummy scans or steady state cycles to facilitate the elimination of artifacts. Such an experiment may take as long as several to tens of hours depending on the extent of the data set collected. As the length of the experiment increases, the necessity for backing up the data onto disk also increases to avoid loss of data in the event of power failure or the like. These input/output procedures add to the overall experiment time significantly, thereby exacerbating the problem of inefficient use of a computer for significant periods for only one experiment. These problems become more significant with the advent of 3D-FT-NMR or higher multi-dimensional NMR experiments which require the acquisition of enormous data sets. For example, in a recent publication of a 3D NMR experiment, by Boelens, et al. *J. Am. Chem. Soc.* 111, 8525 (1989), a spectrum was recorded with two dummy scans and eight scans and resulted in a real 200* 224* 512 data matrix in the $t_1$, $t_2$ and $t_3$ dimension, respectively. The experiment took approximately 137 hours of machine time, with disk input/output operations accounting for about 29 hours of this total. Similarly, the acquisition methods used in imaging techniques may lead to visual artifacts which obscure important diagnostic information. The present methods of reducing artifacts in imaging require additional steady state cycles or pulse sequences to establish steady state magnetization, measure error components or attempt to remove residual magnetization effects. All these methods will add to some degree the acquisition time needed to obtain as error-free data as possible which may be unacceptable in imaging due to patient comfort and similar considerations.

SUMMARY OF THE INVENTION

It, thus, appears desirable to design a data collection method and sequence pulse methodology that will eliminate or substantially reduce discrete artifacts produced due to the pulse sequences utilized without incurring additional acquisition times.

The instrument hardware sources of artifacts can be eliminated by careful instrument design and maintenance, but post acquisition sources including both baseline errors and residual magnetization effects have presented obstacles to artifact free acquisition. Additionally, the use of dummy scans and the necessity of backing data up to the disk has increased experiment times significantly.

The present invention sets forth an alternative method for multi-dimensional NMR data collection where a single transient of data is collected for all values of $t_1$ with the phases held constant. The phases may then be incremented, using a phase cycling sequence, after collection of the single transient for all $t_1$ values. This method reduces or eliminates residual magnetization effects in many situations and has the extra advantage of requiring considerably fewer steady state cycles when signal to noise is not the limiting factor (i.e. when NI>NT).

Additionally, all of the acquired data can be placed in memory until the entire experiment is completed, thereby requiring fewer disk accesses. In this way, the method has been found to shorten a 15-20 minute COSY experiment to less than 2 minutes. Similarly, with 3D-NMR experiments becoming more common with the advance of computer technology, experiment times can be reduced dramatically. The significant reductions in experiment times will give th spectroscopist the ability to conduct more experiments and to make more effective use of the facilities available. In the event that periodic backup is desired, this can still be done in the present invention at multiples of transients that complete a phase cycle or after transients have been collected for all $t_1$ increments.

Generally, the method comprises the steps of performing an excitation pulse sequence having at least one RF pulse and at least one evolution period. The pulse sequence is repeated a number of times while the evolution period is varied in a predetermined manner. A transient is collected for each evolution period and is stored in computer memory. These steps are then repeated a number of times while varying the phase of at least one RF pulse, and again transients are collected for each evolution period. After accumulation of all transient data, the transients collected having common evolution times may be signal averaged and Fourier transformation performed to obtain the NMR data.

BRIEF DESCRIPTION OF THE DRAWINGS

The objects and advantages of the invention will become apparent from a reading of the detailed description in conjunction with the accompanying drawings, wherein:

FIGS. 1a and 1b show a pulse sequence of a conventional 2-D COSY experiment;

FIGS. 2a, 2b, 2c and 2d show vector diagrams illustrating the behavior of transverse and longitudinal magnetization components of an isolated spin, with long relaxation time as it undergoes a first cycle in a standard data acquisition method shown in FIG. 1;

FIGS. 3a, 3b, 3c and 3d show vector diagrams illustrating the behavior of transverse and longitudinal magnetization components as in FIG. 2 during a second cycle of the standard data acquisition method;

FIG. 4 shows the COSY spectra obtained using the standard data acquisition method of FIG. 1;

FIGS. 5a and 5b show a pulse sequence for an alternate COSY experiment using the data acquisition method of the present invention;

FIGS. 6a, 6b, 6c and 6d show vector diagrams illustrating the behavior of transverse and longitudinal magnetization components of an isolated spin, with long relaxation time, as it undergoes a first cycle of the acquisition method of the invention;

FIGS. 7a, 7b, 7c and 7d show vector diagrams illustrating he behavior of transverse and longitudinal magnetization components as in FIG. 6 as it undergoes a second cycle of the acquisition method of the invention;

FIG. 8 shows the COSY spectra obtained using the alternate data acquisition method of the present invention showing artifact suppression as compared to the standard COSY spectra obtained with reference to FIG. 4.

FIG. 9a and 9b show a pulse sequence for an alternate 2D-Inadequate experiment using the data acquisition method of the present invention; and FIG. 10A and 10B show a pulse sequence for an alternate 3D COSY/HMQC experiment using the acquisition method of the present invention.

DETAILED DESCRIPTION OF THE INVENTION

With reference to FIGS. 1-4, a standard COSY experiment and the spectra obtained for a particular experiment are shown. As seen in FIG. 1, a typical COSY experiment comprises the standard data collection method which involves collection of the total number of transients averged for a single $t_1$ increment, after which the $t_1$ increment is modified for collection of another set of averaged transients for the modified increment. A CYCLOPS phase cycling technique may be used for systematic elimination of artifacts and the pulse sequence as shown in FIG. 1 may be as set forth in Equation 1 with the phases of the RF pulses being $\phi_1 = x$ where $x = 0°, 90°, 180°,$ and $270°$ with $\phi_2 = x,y$ where $x = 0°, 90°, 180°,$ and $270°$ and $y = x + 90°$. The relaxation delay, $D_1$ as shown at 10 is normally chosen in the range from 0 to 1 second to permit reasonably short experimental times. In a first cycle of the sequence, the first 90° pulse 12 is imposed on the system and a first $nt_1$ increment forms an evolution period after which a second 90° pulse 16 with its phase varied, is imposed on the system. After the pulse 16, a detection or acquisition period $t_2$ shown at 18 allows generation of a free induction decay (FID) signal which is collected. This pulse sequence is repeated a number of times to obtain a number of transients which are averaged for each $t_1$ increment. Additionally, phase cycling is employed for the elimination of artifacts and cancellation of DC offsets which may arise from imbalanced receiver channels. It should also be understood that a series of dummy scans or steady state pulses as shown in equation 1 are normally utilized for artifact suppression which greatly increase the experimental time necessary. As seen in FIG. 1b, a similar pulse sequence is then performed for a different evolution period or $(nt_1)$ $t_1$ increment at 20 and this procedure is also repeated for the number of $t_1$ increments desired.

As previously described with short repetition times or relaxation delays $D_1$, the longitudinal and transverse magnetization components of the protons in the system will normally survive the first 90-$t_1$ -90 cycle and will subsequently be carried through additional cycles in the pulse sequence. It should be evident that the residual magnetization components may be carried through many cycles and contribute to the observed signal in subsequent transients. This is especially the case where the protons in the system have long relaxation times and/or produce intense sharp signals in the observed spectra. The residual magnetization components which survive through a subsequent cycle carry a history of their behavior through subsequent evolution periods and will produce artifacts at a multiple of a the precession frequencies of the protons in the system.

As seen in FIG. 2, the vector diagrams illustrate the behavior of an isolated spin during the experiment as outlined in FIG. 1. As seen in FIG. 2a, the relaxation delay $D_1$ at shown at 10 in FIG. 1a is followed by a first 90° pulse 12 after which the evolution period t at 14 is imposed on the system and the second 90° pulse 16 results in the transverse and longitudinal magnetization components as shown at FIG. 2(d) for the first collected transient. In FIG. 3, after the relaxation delay of the second pulse cycle in the sequence, it should be evident that residual magnetization components remain, the history of which is carried into the next cycle. As seen at FIG. 3(d), the residual magnetization components are evident in the transient obtained and will produce artifacts due to these undesirable magnetization components.

The COSY experiment as described with reference to FIGS. 1-3 were used in the collection of COSY spectra for trans-stilbene as seen in FIG. 4. The spectrum was obtained on a VXR-300 which was rigorously prepared to eliminate artifacts arising from hardware instabilities.

In the collection of the data there was no sample spinning, the temperature was regulated to 25° C., and phase sensitive detection was utilized. Additionally, a spectral window of 300 HZ. in both dimensions and a one second relaxation delay were utilized. The pulse sequence resulted in collection of 16 transients with CYCLOPS phase cycling of the receiver and the second pulse with 16 dummy scans utilized before data averaging in order to establish steady state magnetization. The standard method for collection of COSY spectra, for example, will generally produce artifacts at the frequencies of strong narrow resonances in the system. These artifacts can easily be confused with peaks that indicate J-coupling and lead to misinterpretation of the obtained spectra. For the trans-stilbene system as shown in FIG. 4, there is a ridge of signals along the vertical line at 7.2 PPM as shown at the circled regions in FIG. 4. The presence of spectral artifacts such as were found in the trans-stilbene and the difficulty of their removal present the major obstacles to routine use of multi-dimensional NMR spectrum.

The present invention sets forth an acquisition method which will minimize or alleviate artifacts which have previously been overlooked in the prior art. The acquisition method relies upon a better understanding of the relationships between pulse phase cycling and residual magnetization components which may lead to spectral artifacts. The acquisition method will obtain cleaner, more easily interpretable multi-dimensional NMR data under many circumstances and will facilitate interpretation by both specialists and non-specialists in the field. Although the following description of the method refers to a spectroscopy experiment, the method may be utilized in other spectroscopic studies or with imaging techniques. The method of the present invention comprises the collection of a single transient of data for all $t_1$ increments with the phases held constant. After the total number of transients are collected for the total number of $t_1$ increments, the sequence may be repeated with the phases incremented using a conventional phase cycling technique such as CYCLOPS. The pulse sequence identifying the method of the present invention can be stated as follows:

$$[(90_x\text{-}0\text{-}90_x\text{-}AT), (90_x\text{-}T\text{-}90_x\text{-}AT), (90_x\text{-}2T\text{-}90_x\text{-}AT), \ldots, \quad (4)$$

$$(90_x\text{-}nT\text{-}90_x\text{-}AT), (90_x\text{-}0\text{-}90_y\text{-}AT), (90_x\text{-}T\text{-}90_y\text{-}AT),$$

$$(90_x\text{-}2T\text{-}90_y\text{-}AT), \ldots, (90_x\text{-}nT\text{-}90_y\text{-}AT)]_{NT}$$

where x=0°, 90°, 180°, 270°, y=x+90°, n=the number of $t_1$ increment, AT=acquisition time, and NT=the number of transients averaged. It has been shown that this acquisition technique provides considerably better artifact suppression while requiring fewer steady state cycles when signal-to-noise is not the limiting factor or when the number of $t_1$ increments is greater than the number of transients averaged in the sequence.

This pulse sequence is more clearly seen with reference to a specific 2-D NMR experiment, a COSY sequence shown in FIG. 5, wherein in FIG. 5a a first relaxation delay $D_1$ shown at 30 precedes a first 90° pulse 32 having a predetermined phase. A first evolution period 34 being a first $nt_1$ increment is followed by a second 90° pulse 36 having the same phase as pulse 32. After pulse 36 is a detection or acquisition period 38 in which a generated FID is obtained and recorded. This sequence is repeated after incrementing $t_1$ for the total number of $t_1$ increments. As shown in FIG. 5b, after a single transient has been obtained for the total number of $t_1$ increments in FIG. 5a, phase cycling is used wherein after a relaxation delay $D_1$ at 40, a first 90° pulse 42 having a predetermined phase is initiated followed by an evolution period 44 being the first $nt_1$ increment. A second 90° pulse 96 having its phase varied from pulse 42 according to a phase cycling technique is then imposed on the system and a detection or acquisition period 48 result in generation of a FID which is recorded. As with FIG. 5a, with the phase incremented in the cycle of FIG. 5b, transients will be collected for all $t_1$ values at this phase relationship. This procedure is repeated through the desired phase variations to obtain the multi-dimensional NMR spectra using the acquisition method of the invention. The evolution period 44 may be incremented in a linear fashion by the amount $\delta = 1/SW2$ or in a non-linear fashion wherein masks may be utilized in the Fourier transformation of the NMR data.

Turning now to FIG. 6, the vector diagrams illustrate the behavior of the transverse and longitudinal magnetization components of a single isolated spin in response to the pulse sequence described with reference to FIG. 5. In this COSY pulse sequence using the acquisition method of the invention, the first 90° pulse will produce a flip angle as seen in FIG. 6(b) after which the $t_1$ evolution period will result in the magnetization components as seen in FIG. 6(c). The second 90° pulse having the same phase as the first 90° pulse will produce the FID to be acquired with the magnetization components as seen in FIG. 6(d). After a relaxation delay, the second pulse sequence of FIG. 5b is imposed and it is clearly seen in FIG. 7 that most precession of the magnetization during the first cycle is cancelled during the second cycle.

FIG. 7 shows the second cycle of the COSY sequence using the alternate acquisition method of the invention wherein there is no 90° phase shift with respect to the first cycle and $t_1$ has been incremented between cycles. The first 90° pulse of the second cycle produces the magnetization components as seen in FIG. 7(b) after which the new evolution period being the incremented $t_1$ period will result in components as shown in FIGS. 7(c). The second 90° pulse having the same phase relationship as the first 90° pulse will result in the transverse and longitudinal magnetization components as seen in FIG. 7(d) which is substantially free of any precession due to the magnetization of the first cycle. Thus, no residual magnetization modulation effects will be reduced or eliminated in the transient developed from the second cycle as seen in FIG. 7. It is also noted that any net precession of the signal components which survive two cycles is modulated by the difference between the evolution time in the two cycles which in the method of the invention is always a constant and therefore no modulation occurs.

The effects as indicated in FIGS. 6 and 7 may be empirically shown using the COSY experiment. It can be shown that the total magnetization from the first COSY cycle carried through the second COSY cycle without a 90° phase shift while incrementing the $t_1$ evolution period will give an observable signal for an AB system as follows:

$$\sigma^{obs} = I_{Ax} \sin(\Omega_A t_1) \cos(\pi J t_1) + \quad (5)$$

$$I_{Bx} \sin(\Omega_B t_1) \cos(\pi J t_1) - 2I_{Az}I_{By} \sin(\Omega_A t_1) -$$

$$2I_{Ay} \sin(\Omega_B t_1) \sin(\pi J t_1) - I_{Ax} \sin(\Omega_A \delta) \cos(\pi J \delta) +$$

-continued $$I_{Bx} \sin(\Omega_B \delta) \cos(\pi J \delta) + 2I_{Az}I_{By} \sin(\Omega_A \delta) \sin(\pi J \delta) +$$
$$2I_{Ay}I_{Bz} \sin(\Omega_B \delta) \sin(\pi J \delta).$$

where $\Omega_A$, $\Omega_B$ are the precession frequencies to the protons A, B in the system, x and $\delta = 1/sw2$ being the difference between the evolution time between the cycles which may be constant or variable. The first four terms are the normal COSY diagonal and cross peaks similar to the observable signal generated by a standard COSY acquisition method. The residual magnetization components which are normally associated with a standard COSY acquisition method are not evident and the last four terms in the prior equation will at worst produce a signal at the carrier frequency in the $f_1$ dimension. The artifacts which may be generated due to the last four terms of the observable signal may be removed by software correction for DC offsets in the FID during Fourier transform, or by phase cycling techniques over the entire experiment.

The artifact suppression obtainable by use of the acquisition method of the invention may be clearly seen from reference to FIG. 8 which shows a COSY spectrum of trans-stilbene collected using the same sample during the same time period as that of FIG. 4. The COSY spectra obtained and shown in FIG. 8 were conducted on the same instrument under the same conditions as the spectra obtained in FIG. 4. The artifacts which were seen as a ridge of signals along the vertical line at 7.2 PPM have been greatly suppressed and the method has greatly reduced the false peaks associated with residual magnetization effects. In the spectrum as shown in FIG. 8, it is possible to see cross peaks in the circled regions due to long range coupling between the olefin and orthoprotons in the trans-stilbene system.

For the experienced spectroscopist, identification of the real peaks of the obtained NMR spectra are normally fairly accurate, but the acquisition method of the invention will allow persons with lesser training to correctly identify peaks by the artifact suppression realized. Similarly, if resonance assignments for the protons in the system are straightforward, but artifacts present in the spectrum may interfere and prevent quantitative peak volume integrations which are needed to obtain reliable internuclear distances from NOESY type experiments. By the artifact suppression of the method, reliable quantitative peak volume integrations can be obtained thereby generating accurate internuclear distances. The method of the invention may also be very helpful in conjunction with other new methods for producing multi-dimensional NMR spectra. For example, the acquisition method in conjunction with digital filtering, multi-variate analysis or pattern recognition techniques may lead to more accurate information being obtained from the spectra.

Although the acquisition method has been described in relation to a COSY experiment, artifact suppression in other homonuclear or heteronuclear shift correlation spectra obtained by multi-dimensional NMR techniques may also be realized. Similarly, imaging may be accomplished using selective gradient fields and an excitation pulse sequence wherein artifacts will be greatly reduced or eliminated. For example, other multi-dimensional NMR spectroscopy pulse sequences known in the art may utilize the method t gain artifact reduction, time savings or both. Application of the method to other known pulse sequences, as seen with reference to FIGS. 9 and 10, should be apparent for a multiplicity of applications. FIG. 9a shows a pulse sequence for a 2D-Inadequate experiment. This sequence comprises a first relaxation delay D, at 50 precedes a first 90° pulse 52 having a predetermined phase. A mixing period 54 follows the pulse 52 after which a 180° pulse 56 having a predetermined phase is imposed on the system. Another mixing period 58 follows pulse 56 and another 90° pulse 60 having a predetermined phase is then applied. A first evolution period 62 being a first $nt_1$ increment is followed by another 90° pulse 64 having a predetermined phase. After pulse 64, a detection or acquisition period 66 in which NMR transient data is obtained and recorded. This sequence is repeated after incrementing the $t_1$ evolution period for all values of $t_1$ with the phases of all RF pulses in the sequence remaining constant. As shown in FIG. 9b, after a single transient is obtained for all $t_1$ increments as in FIG. 9a, the phase of one of the RF pulses in the sequence will be varied and a single transient will again be obtained for all $t_1$ increments. As seen in FIG. 9b, the pulse sequence may remain substantially similar except for the 90° pulse 68 having its phase varied according to conventional phase cycling techniques. This procedure may be repeated while varying the phase of one or more of the RF pulses. Once all transient data is obtained, transients having common $t_1$ increments may be signal averaged and a Fourier transform applied to obtain spectral or other information.

Another example of the acquisition technique can be seen in reference to FIG. 10, wherein a 3D COSY/HMQC NMR experiment is shown. In FIG. 10a, a first cycle of the pulse sequence of this experiment shows a first 90° RF pulse 72 tuned to a predetermined precession frequency of a proton, such as hydrogen, in the system and having a predetermined phase imposed after a first relaxation delay period $D_1$ at 70.

Mixing periods 74 and 80 which are based upon spin-coupling constants surround two 180° RF pulses 76 and 78 each being tuned to a predetermined precession frequency of a proton in the system and having a predetermined phase. Another 90° RF pulse 82 for the first nuclei is followed by a time period 84 which is based upon the relaxation constant of the proton. Subsequent to time period 84, two 90° RF pulses 86 and 88 are applied to both first and second protons in the system, followed by another mixing period 90. A 90° RF pulse 92 is then applied to the second proton, followed by a first evolution period $nt_1$ at 94 wherein a 180° RF pulse 96 is applied to the first proton after half of the evolution period 94. After the evolution period 94, a 90° RF pulse 100 is applied to the second proton which is followed by a second evolution period $mt_2$ at 102 and another 90° RF pulse 104. Another mixing period 106 follows pulse 102 after which an acquisition period $t_3$ at 108 allows generation of a FID which is collected while a saturating RF pulse 10 is applied to the second proton to prevent any NMR signals arising therefrom.

In this sequence, one or both evolution periods may be incremented discretely, and a single transient is obtained for all values of $t_1$, $t_2$ or both. After the first cycle as shown in FIG. 10, one or more phases of the RF pulses used in the sequence are selectively varied and the procedure repeated for all $t_1$ and $t_2$ values. It should be evident that the acquisition method can be used under a large variety of circumstances for many pulse sequences in spectroscopy or imaging applications. It has been found that the method is especially advantageous in pulse sequences which have a total flip angle of 180° or a multiple thereof. In this circumstance, artifact suppression may be more apparent although the time savings benefits of the method are achieved under most circumstances. It should also be recognized that some pulse sequences may use a plurality of evolution periods or may use the length of an RF pulse in the sequence as an evolution period wherein the method may be used effectively. Similarly, the method may be used in conjunction with other acquisition techniques as the particular application requires.

Under many circumstances, the new data acquisition method will prove to be extremely valuable for artifact suppression in the obtained spectra, and may also carry over into imaging techniques. The acquisition method does not require the spectroscopist or imager to learn new experiments or to interpret new forms of data display and thus presents a valuable tool to be utilized in the acquisition of the data. In another aspect of the invention, the speed with which multi-dimensional NMR data can be obtained is greatly increased by the acquisition method of the invention. The method requires considerably fewer steady state cycles or dummy scans at least when signal-to-noise is not the limiting factor in the system. This in itself can reduce considerably the experimental time of normal 2D or 3D experiments which utilize anywhere from 2 to 16 or more dummy pulses before data averaging in order to establish steady state magnetization. This ensures variable disk access times do not contribute to artifacts arising from disruptions of a steady state. Such dummy scans are not collected and do not contribute to obtained spectra, but still must be conducted accurately to establish steady state magnetization.

Additionally, by reducing the actual time necessary to obtain the desired NMR data, there may be no need to access the disk for storing the obtained data during the experiment. Using the acquisition method of the invention, all of the data is acquired in memory until the entire experiment is completed and no back up is required or essential as the experimental time is short. As mentioned previously with recent 3D experiments using standard acquisition techniques, the time required for input/output operations to disk may be considerable and adds significantly to the total time of the experiment. Using the method of the present invention, this additional time can be eliminated completely or if periodic data back up during long experiments is desired, this can still be done at multiples of transients that complete a phase cycle.

As an example, a typical COSY experiment which would take on the order of 15 to 20 minutes can be reduced to less than 2 minutes using the acquisition method of the invention. Similarly, in much longer 3D experiments, what may have taken up to three or four days of instrument time would now take on the order of less than one day thereby freeing the instrument for additional experiments. The method can therefore be used in the efficient and economic use of an instrument to obtain the most benefit therefrom. It should also be recognized that imaging techniques may be conducted with shorter acquisition times thereby reducing the time the patient need be exposed in an NMR imaging apparatus. As this time is extremely important as an aesthetic consideration, the method allows more complete and accurate information to be obtained in an equivalent or shorter time period.

Although the foregoing description is directed to several specific examples using the acquisition method of the invention, it will be apparent to those skilled in the art that various modifications can be made without departing from the principles and spirit of the invention as defined in the appended claims.

What is claimed is:

1. A method of data acquisition for Fourier transform NMR data comprising the steps of:
    a) performing an excitation pulse sequence of at least one RF pulse and at least one evolution period wherein magnetization components of excited nuclei will at least partially relax;
    b) repeating said pulse sequence a plurality of times with said evolution period varied in a predetermined manner for each of said repetitions;
    c) storing for each of said repetitions an acquired NMR transient in computer memory; and
    d) performing Fourier transformation by digital data processing of said transients.

2. The method of claim 1, wherein, said evolution period is incremented in a linear fashion and said step of signal averaging enables suppression of artifacts generated due to residual magnetization effects.

3. The method of claim 1, wherein, said evolution period is incremented in a non-linear fashion and said step of signal averaging enables suppression of artifacts generated due to residual magnetization effects.

4. The method of claim 1, wherein, said excitation pulse sequence includes at least a first 90° RF pulse followed by said at least one evolution period and at least one other RF pulse which in addition to said first 90° RF pulse gives a total flip angle of 180° or a multiple thereof.

5. The method of claim 1, wherein, said step of storing an acquired transient for each of said sequences is accomplished within internal memory of a computer to accumulate all NMR transient data before storing accumulated data on a permanent data storage means.

6. The method of claim 1, wherein, said varied evolution period of said excitation pulse sequence is chosen based on the relaxation times of said excited nuclei.

7. The method of claim 1, further including the steps of:
    repeating steps a)–c) a plurality of times before the step of performing Fourier transformation while varying the phase of at least one RF pulse in said sequence;
    signal averaging the acquired transients which have common evolution periods; and
    performing said step of Fourier transformation of said averaged transients.

8. The method of claim 7, wherein, said step of varying the phase of at least one RF pulse in said sequence includes phase cycling wherein all four phase shifts are imposed during subsequent transients such that an equal number of transients are acquired for each of said phase shifts.

9. The method of claim 1, wherein, said excitation pulse sequence is a multi-dimensional spectroscopy sequence to obtain spectral information of a system with reduced artifacts in the acquired data.

10. The method of claim 1, wherein, said excitation pulse sequence is a multi-dimensional imaging sequence used to derive an image of the examined system with reduced artifacts.

11. The method of claim 1, wherein,
said step of repeating said pulse sequence a plurality of times will result in second and subsequent cycles of said pulse sequence which are substantially free of any precession due to the magnetization of the first cycle of said pulse sequence.

12. The method of claim 7, wherein,
said step of signal averaging the acquired transients having common evolution periods substantially eliminates any net precession of the magnetization signal components which survive between different cycles of said pulse sequence having common evolution times.

13. The method of claim 1, wherein
a plurality of steady state pulse sequences may be used to establish steady state magnetization of a system before the data acquisition method is employed.

14. An acquisition for multi-dimensional Fourier transform NMR data for a system comprising the steps of,
a) applying at least one radio-frequency pulse to a system to excite the spins of at least one desired nuclei, wherein said radio-frequency pulse has a predetermined phase;
b) establishing a first evolution period after the excitation of spins in the system during which the magnetization of said nuclei will at least partially relax;
c) detecting and storing NMR transient signals generated from precession of said nuclei;
d) repeating steps a)-d) a plurality of times with said first evolution period being varied for each repetition;
e) repeating steps a)-e) with said predetermined phase of at least one of said radio frequency pulses varied;
f) signal averaging said detected and stored NMR signals which have common evolution periods; and
g) performing a multi-dimensional Fourier transformation by digital data processing of said averaged NMR signals.

15. The method as in claim 14, wherein
said predetermined phase of said at least one radio frequency pulse is varied according to a phase cycling wherein all four 90° phase shifts are imposed during subsequent transients such that an equal number of transients are acquired for each of said phase shifts.

16. The method of claim 14, wherein,
said step of storing an acquired transient for each of said sequences is accomplished within internal memory of a computer to accumulate all NMR transient data before storing accumulated data on a permanent data storage means.

17. The method of claim 14, wherein,
said excitation pulse sequence is a multidimensional spectroscopy sequence to obtain spectral information of a system with reduced artifacts in the acquired data.

18. The method of claim 14, wherein,
said excitation pulse sequence is a multi-dimensional imaging sequence used to derive an image of the examined system with reduced artifacts.

* * * * *